United States Patent [19]

Sung et al.

[11] Patent Number: 5,717,901
[45] Date of Patent: Feb. 10, 1998

[54] VARIABLE DEPTH AND WIDTH MEMORY DEVICE

[75] Inventors: Chiakang Sung, Milpitas; Wanli Chang, Saratoga; Joseph Huang, San Jose; Richard G. Cliff, Milpitas, all of Calif.

[73] Assignee: Altera Corporation, San Jose, Calif.

[21] Appl. No.: 555,109

[22] Filed: Nov. 8, 1995

Related U.S. Application Data

[63] Continuation-in-part of Ser. No. 442,795, May 17, 1995.

[51] Int. Cl.$^6$ ........................................... G06F 12/00
[52] U.S. Cl. ............... 395/497.01; 395/432; 395/497.02; 326/38; 326/39; 326/40; 326/41
[58] Field of Search ........................... 326/38, 39, 40, 326/41; 395/250, 497.01, 497.02, 432

[56] References Cited

U.S. PATENT DOCUMENTS

| | | | |
|---|---|---|---|
| Re. 34,363 | 8/1993 | Freeman | 326/38 |
| 3,473,160 | 10/1969 | Wahlstrom | 227/100 |
| 4,593,373 | 6/1986 | Kiuchi et al. | 364/736 |
| 4,609,986 | 9/1986 | Hartmann et al. | 326/45 |
| 4,617,479 | 10/1986 | Hartmann et al. | 365/185.17 |
| 4,642,487 | 2/1987 | Carter | 326/41 |
| 4,677,318 | 6/1987 | Veenstra | 326/40 |
| 4,713,792 | 12/1987 | Hartmann et al. | 395/430 |
| 4,751,671 | 6/1988 | Babetski et al. | 395/250 |
| 4,758,745 | 7/1988 | Elgamal et al. | 326/16 |
| 4,774,421 | 9/1988 | Hartmann et al. | 365/185.17 |
| 4,871,930 | 10/1989 | Wong et al. | 326/39 |
| 4,899,067 | 2/1990 | So et al. | 326/38 |
| 4,912,342 | 3/1990 | Wong et al. | 326/40 |
| 4,942,541 | 7/1990 | Hoel et al. | 395/115 |
| 5,027,326 | 6/1991 | Jones | 365/221 |
| 5,121,006 | 6/1992 | Pedersen | 326/38 |
| 5,146,428 | 9/1992 | Tanimura | 365/189.08 |
| 5,220,214 | 6/1993 | Pedersen | 326/46 |
| 5,258,668 | 11/1993 | Cliff et al. | 326/41 |
| 5,260,610 | 11/1993 | Pedersen et al. | 326/41 |
| 5,260,611 | 11/1993 | Cliff et al. | 326/39 |
| 5,274,581 | 12/1993 | Cliff et al. | 364/784 |

(List continued on next page.)

FOREIGN PATENT DOCUMENTS 0 156 316   10/1985   European Pat. Off.

OTHER PUBLICATIONS

R.C. Minnick, "A Survey of Microcellular Research," Journal of the Association for Computing Machinery, vol. 14, No. 2, pp. 203–241, Apr. 1967.

S.E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

(List continued on next page.)

*Primary Examiner*—Tod R. Swann
*Assistant Examiner*—J. Peikari
*Attorney, Agent, or Firm*—Fish & Neave; Robert R. Jackson; G. Victor Treyz

[57] ABSTRACT

A programmable variable depth and width random-access memory circuit is provided. The memory circuit contains rows and columns of memory cells for storing data. A row decoder is used to address individual rows of the memory cells. Column address circuitry receives a column address signal and a width and depth selection signal. A column decoder within the column address circuitry addresses one or more columns of memory cells of the RAM array based on the selected width of the array. The output of the column decoder is routed to the appropriate column or columns of memory cells by a pattern of fixed connections and a group of programmable multiplexers. The number of data output lines to which data signals are provided is determined by the selected width of the RAM array. The output circuitry contains a group of programmable demultiplexers and a routing array having a pattern of fixed connections suitable for passing data signals from the RAM array to the selected number of data output lines.

15 Claims, 4 Drawing Sheets

U.S. PATENT DOCUMENTS

| | | | |
|---|---|---|---|
| 5,350,954 | 9/1994 | Patel | 326/39 |
| 5,371,422 | 12/1994 | Patel et al. | 326/41 |
| 5,396,608 | 3/1995 | Garde | 395/410 |
| 5,506,850 | 4/1996 | Osann, Jr. | 371/22.1 |

OTHER PUBLICATIONS

El Gamal et al., "An Architecture for Electrically Configurable Gate Arrays," IEEE Journal of Solid–State Circuits, vol. 24, No. 2, Apr. 1989, pp. 394–398.

El–Ayat et al. "A CMOS Electrically Configurable Gate Array," IEEE Journal of Solid–State Circuits, vol. 24, No. 3, Jun. 1989, pp. 752–762.

"XC5000 Logic Cell Array Family, Technical Data, Advance Information," Xilinx, Inc., Feb. 1995.

John L. Nichols, "A Logical Next Step for Read–Only Memories", Electronics, Jun. 12, 1967, pp. 111–113.

Floyd Kvamme, "Standard Read–Only Memories Simplify Complex Logic Design", Electronics, Jan. 5, 1970, pp. 88–95.

Albert Hemel, "Making Small ROM's [sic] Do Math Quickly, Cheaply and Easily", Electronics, May 11, 1970, pp. 104–111.

William I. Fletcher et al., "Simplify Sequential Circuit Designs", Electronic Design, Jul. 8, 1971, pp. 70–72.

Howard A. Sholl et al., "Design of Asynchronous Sequential Networks Using Read–Only Memories", IEEE Transactions on Computers, vol. C–24, No. 2, Feb. 1975, pp. 195–206.

Arnold Weinberger, "High–Speed Programmable Logic Array Adders", IBM J. Res. Develop., vol. 23, No. 2, Mar. 1979, pp. 163–178.

Yahiko Kambayashi, "Logic Design of Programmable Logic Arrays", IEEE Transactions on Computers, vol. C–28, No. 9, Sep. 1979, pp. 609–617.

VARIABLE DEPTH AND WIDTH MEMORY DEVICE

This application is a continuation-in-part of application Ser. No. 08/442,795, filed May 17, 1995.

BACKGROUND OF THE INVENTION

This invention relates to integrated circuit random access memory devices, and more particularly, to techniques for configuring the depth and width of a region of random access memory.

Integrated circuit random-access memory (RAM) devices are widely used in electronic systems. Such memory devices are typically characterized by a depth and a width. The width of a device is the number of parallel data output lines available for reading out data stored in the device. The depth of a device is the maximum number of data bits that may be accessed via each of the data output lines. For example, devices with a total storage capacity of two kilobits of data are available in 2K×1 and 1K×2 configurations. A 1K×2 device has a width of two and a depth of 1 kilobit (1024 bits). A 2K×1 device has a width of one and a depth of two kilobits.

Because random-access memory devices are available in various depth and width configurations, a designer of an electronic system is generally able to select a memory device with a depth and width suitable for use in the system. However, in some applications it would be desireable to be able to reconfigure the depth and width of a selected memory device without having to use an entirely new part.

In addition, programmable logic devices sometimes contain regions of RAM, as described in commonly assigned co-pending Cliff et al. U.S. patent application Ser. No. 08/442,795, filed May 17, 1995, which is hereby incorporated by reference herein. Programmable logic devices can be programmed by a user to perform a variety of logic functions. To enhance the flexibility of a programmable logic device containing a region of RAM, it would be useful if were possible to program the region of RAM to various depth and width configurations.

Gate arrays sometimes contain blocks of RAM. If only part of the block of RAM is connected to the logic circuitry of the gate array during fabrication, the depth and width of the RAM that is used can be varied. For example, if a gate array contains a 2K×2 RAM array block, it is possible to fabricate the connections between the gate array logic circuitry and the RAM so that only a 2K×1 region of RAM is used. Alternatively, the gate array can be fabricated so that only a 1K×2 region is used. However, selectively connecting only portions of the block of RAM to the logic circuitry of the gate array is inefficient, because the portion of RAM that is not connected to the logic circuitry cannot be used. Further, because gate arrays are generally configured using custom masks, they are not field programmable and cannot be reconfigured after fabrication.

Some gate arrays, known as field programmable gate arrays, are reprogrammable. Field programmable gate arrays typically contain numerous configurable logic blocks, each of which may contain a small amount of RAM. Although it might be possible to connect a number of the configurable logic blocks together to provide a large region of RAM, such an arrangement is unlikely to be satisfactory. The process of passing signals to and from a configurable logic block is relatively slow. Further, field programmable gate arrays do not contain row and column decoders for addressing RAM arrays. Although some decoding functions might be provided by the configurable logic blocks, using configurable logic blocks to build decoders would be cumbersome. Using the configurable logic blocks for decoding would also be slower than using dedicated row and column decoder circuitry.

It is therefore an object of the present invention to provide a programmable random-access memory circuit.

It is a further object of the present invention to provide a variable depth and width random-access memory circuit.

SUMMARY OF THE INVENTION

These and other objects of the invention are accomplished in accordance with the principles of the present invention by providing a programmable variable depth and width random-access memory circuit. The memory circuit contains rows and columns of memory cells for storing data. Row and column address circuitry is used to address the cells. Output circuitry is used to route data from the array to one or more data output lines.

The row address circuitry contains a row decoder. A row address signal is provided to the row decoder that causes the row decoder to address an individual row of memory cells in the array.

The column address circuitry receives a column address signal and a depth and width selection signal. A column decoder within the column address circuitry addresses one or more columns of memory cells in the RAM array based on the selected width of the array. The output of the column decoder is routed to the appropriate column or columns of memory cells by a routing array having a pattern of fixed connections and by a group of programmable multiplexers.

The number of data output lines to which data signals are provided is determined by the selected width of the RAM array. The output circuitry contains a group of programmable demultiplexers and a routing array having a pattern of fixed connections suitable for passing data signals from the RAM array to the selected number of data output lines.

If desired, the random-access memory circuit can be provided as part of a programmable logic device that uses programmable RAM or as part of any other suitable integrated circuit. The random-access memory circuit can also be provided as a discrete integrated circuit device.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
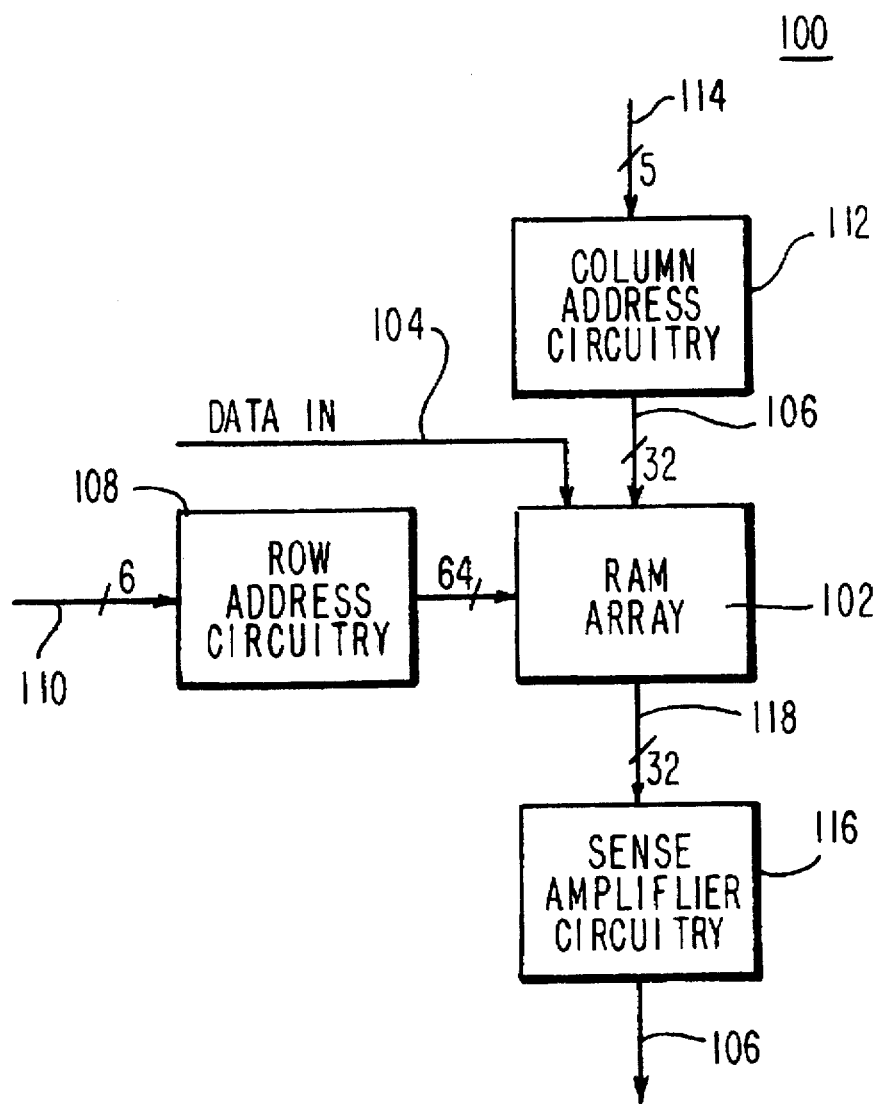
FIG. 1 is a schematic diagram of a conventional 2K×1 memory device.

A conventional 2K×1 memory device 100 is shown in FIG. 1. Memory device 100 has a two kilobit random access memory (RAM) array 102, which has 64 rows and 32 columns of memory cells (not shown). Data is written into the memory cells of array 102 using data input line 104. Data is read out of the memory cells via data output line 106. Row address circuitry 108 accepts a six bit address signal at input 110, which allows row address circuitry 108 to address a selected one of the 64 rows of memory cells in array 102. Column address circuitry 112 accepts a five bit address signal at input 114, which allows column address circuitry 112 to address a selected one of the 32 columns of memory cells in array 102.

Sense amplifier circuitry 116 receives 32 data output lines 118 from array 102. Sense amplifier circuitry 116 amplifies the data received from array 102 on data output lines 118 and combines these 32 data output lines 118 to form output 106. Because memory device 100 has a single output 106 and because the maximum amount of data that can be read out of output 106 is two kilobits, the memory device 100 is said to have a "depth" of 2K and a "width" of one. Because the depth and width of memory device 100 are fixed, if it is desired to use a memory configuration other than the 2K×1 RAM configuration of FIG. 1, memory device 100 cannot be used.

Figure 2:
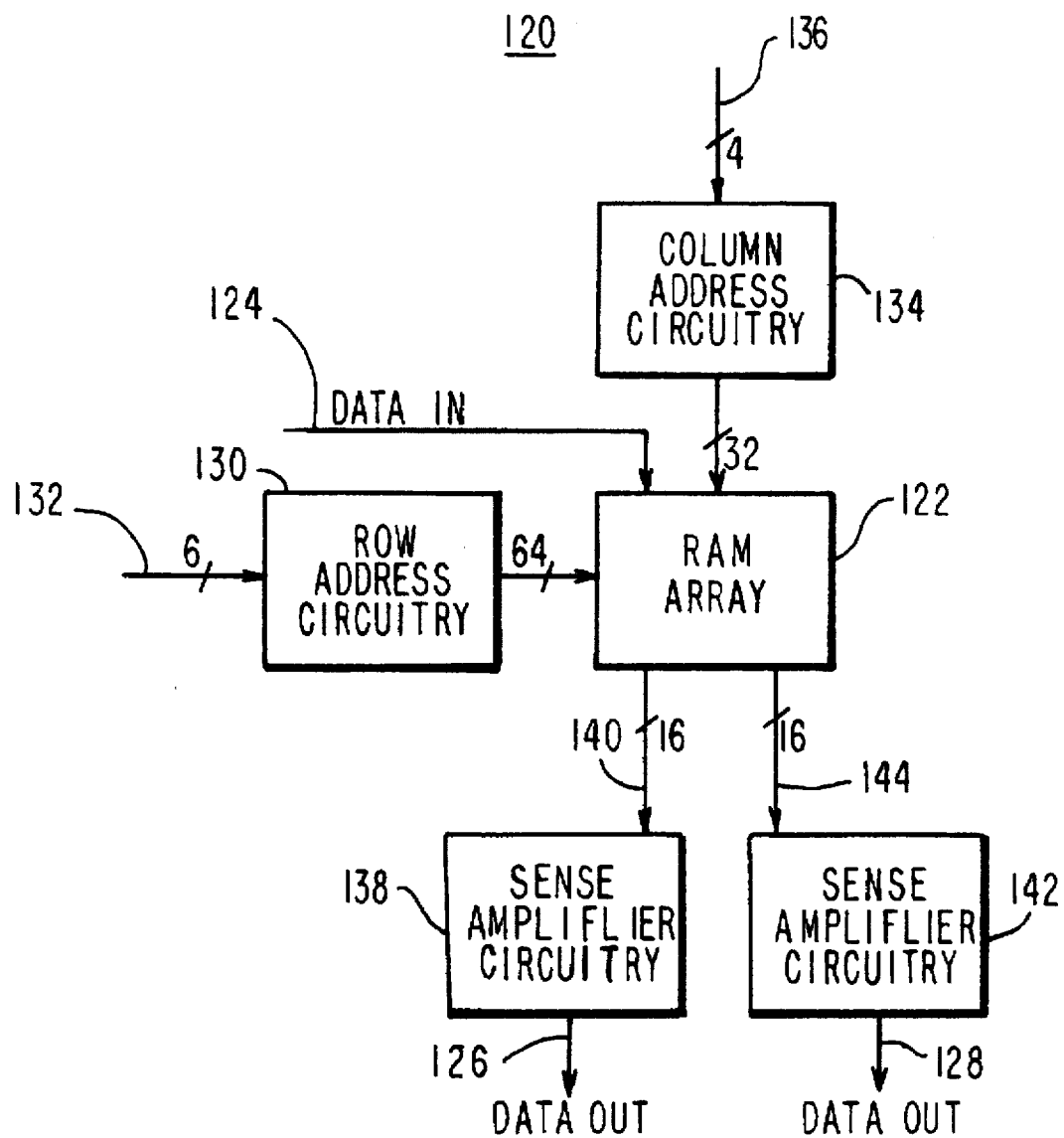
FIG. 2 is schematic diagram of a conventional 1K×2 memory device.

A conventional 1K×2 memory device 120 is shown in FIG. 2. Memory device 120 has a two kilobit RAM array 122, which has 64 rows and 32 columns of memory cells (not shown). Data is written into the memory cells of array 122 using data input line 124. Data is read out of the memory cells via two data output lines: data output line 126 and data output line 128. Row address circuitry 130 accepts a six bit address signal at input 132, which allows row address circuitry 130 to address a selected one of the 64 rows of memory cells in array 122. Column address circuitry 134 accepts a four bit address signal at input 136, which allows column address circuitry 134 to address a selected pair of the 32 columns of memory cells in array 122 (e.g., column 0 and column 16 or column 1 and column 17).

Sense amplifier circuitry 138 receives 16 data output lines 140 from the first half of the columns of array 122 (e.g., columns 0 through 15). Sense amplifier circuitry 142 receives 16 data output lines 144 from the second half of the columns of array 122 (e.g., columns 16 through 31). Sense amplifier circuitry 138 amplifies the data received from array 122 on data output lines 140 and combines these 16 data output lines 140 to form the data output line 126. Sense amplifier circuitry 142 amplifies the data received from array 122 on data output lines 144 and combines these 16 data output lines 144 to form data output line 128. Addressing a pair of columns with column address circuitry 134 therefore causes the data from two associated memory cells of array 122 to be provided in parallel at data output lines 126 and 128. The maximum amount of data that can be read out of either data output line 126 or data output line 128 is 1K. The memory device 120 therefore has a depth of 1K and a width of two. The depth and width of memory device 120 are fixed, so if it is desired to use a memory configuration other than the 1K×2 configuration of FIG. 2, memory device 120 cannot be used.

Figure 3:
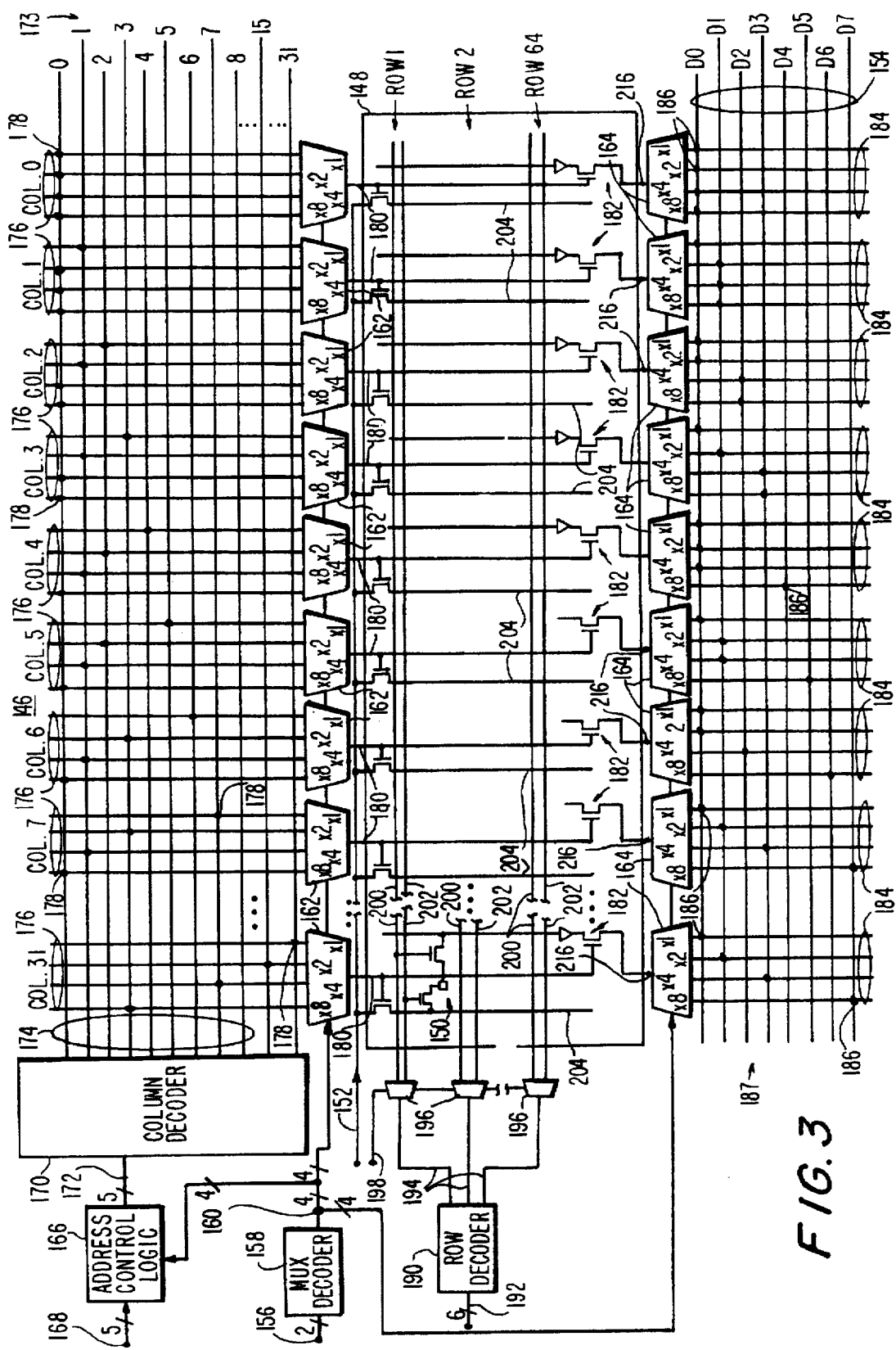
FIG. 3 is a circuit diagram of a variable depth and width memory device in accordance with the present invention.

A variable depth and width memory circuit 146 in accordance with the present invention is shown in FIG. 3. Memory circuit 146 has a two kilobit RAM array 148, which has 64 rows and 32 columns of memory cells 150. Only one memory cell 150 is shown in FIG. 3 to avoid overcomplicating the drawing. Data may be written into memory cells 150 of array 148 using data input line 152. Data is read out of the memory cells via one or more of eight data output lines 154.

The number of data output lines 154 on which data is provided depends on the width selected for memory circuit 146. If memory circuit 146 has been programmed to have a width of one (the ×1 mode), data is provide on a single one of the data output lines 154 (output line D0). If the programmed width is two (the ×2 mode), then data is provided using two data output lines 154 (output lines D0 and D1). If the width is four (the ×4 mode) data is provided on data output lines D0, D1, D2, and D3. If the width is eight (the ×8 mode), data is provided on all eight of data output lines 154 (D0–D7).

The depth of memory circuit 146 varies depending on the chosen width of memory circuit 146. For example, if the width is one, the depth is 2K. Widths of two, four, and eight result in depths of 1K, 512, and 256, respectively.

The depth and width of memory circuit 146 are preferably determined by a two-bit depth and width mode selection signal applied to input 156 of multiplexer decoder 158. Multiplexer decoder 158 converts the two bit selection signal at input 156 to four depth and width control signals at output 160. The depth and width control signals at output 160 are provided to multiplexers 162, demultiplexers 164, and address control logic 166.

Address control logic 166 accepts a column address signal at input 168. In the ×1 mode, a five bit column address is used in conjunction with a six bit row address to address individual memory cells 150. In configurations of greater width, fewer bits of the column address are used. For example, in the ×2 mode, only a four bit column address is used. The four bit column address and the six bit row address are sufficient to specify a unique pair of memory cells 150 from which two data bits are obtained in parallel in the ×2 mode.

In the ×1 mode, all five bits of the column address supplied to input 168 are passed to column decoder 170. In the ×2 mode, address control logic 166 provides four bits of the column address to column decoder 170 unchanged and assigns the fifth bit to a logical low signal. In the ×2 mode, the fifth bit of the column address at input 168 is therefore a "don't care" bit. In the ×4 mode, address control logic 166 provides three bits of the column address to column decoder 170 unchanged and provides the fourth and fifth bits as logical low signals. The fourth and fifth bits of the column address at input 168 are don't care bits in the ×4 mode. In the ×8 mode, address control logic 166 passes two bits of the column address at input 168 to column decoder 170 unchanged and provides the third, fourth, and fifth bits as logical low signals. The third, fourth, and fifth bits of the column address at input 168 are don't care bits in the ×8 mode. Because address control logic 166 provides column decoder 170 with logical low signals when certain column address bits are not used, column decoder 170 addresses the appropriate column decoder output lines in routing array 173.

Column decoder 170 decodes the address signals provided at input 172 by address control logic 166 and provides a corresponding decoder output signal on output lines 174. Output lines 174 are connected to multiplexers 162 by 32 columns of input routing lines 176. A pattern of fixed connections 178 is used to connect output lines 174 to input routing lines 176. The illustrative pattern of fixed connections 178 shown in FIG. 3 allows output lines 174 to be connected to input routing lines 176 using a minimal amount of integrated circuit surface area. Multiplexers 162 connect the rightmost of the four input routing lines 176 in each of the 32 columns to column select lines 180 when the ×1 mode is selected. Multiplexers 162 connect the input routing lines 176 that are second from the right in each of the 32 columns to the corresponding column select lines 180 when the ×2 mode is selected. In the ×4 and ×8 modes, multiplexers 162 respectively direct the third and fourth input routing lines 176 from the right in each column to the column select lines 180. Column select lines 180 drive the gates of pass transistors 182.

When column addresses are provided to input 168, one or more column select lines 180 go high, depending on the selected mode of memory circuit 146. For example, if it is desired to operate memory circuit 146 in the ×1 mode, the depth and width mode selection signal applied to multiplexer decoder 158 results in control signals at output 160 that direct address control logic 166 to pass the complete five bit column address signal applied to input 168 to column decoder 170. If the five bits of the column address signal are high, low, low, low, and low in the ×1 mode, for example, the column decoder 170 will generate a logical high signal on the 0th (top) output line 174. The 0th output line 174 is connected to a number of multiplexers 162, such as multiplexer 162 in column 5 (via the ×8 input) and multiplexer 162 in column 3 (via the ×8 and ×4 inputs). However, only in column 0 is the 0th output line 174 connected to the ×1 input of one of multiplexers 162. Accordingly, in the ×1 mode only the column select line 180 in column 0 goes high.

When the column select line 180 in column 0 goes high, pass transistor 182 in column 0 is turned on, so that data in column 0 is provided to the demultiplexer 164 in column 0. Demultiplexers 164 are connected to output data lines 154 by output routing lines 184. Output data lines 154 and output routing lines 184 are connected by a pattern of fixed connections 186 in the form of routing array 187. If data is passed from RAM array 148 via the pass transistor 182 in column 0 in the ×1 mode, the data passes from demultiplexer 164 in column 0 to data output line D0 via the connection 186 at the intersection of the ×1 output of demultiplexer 164 and data output line D0. Data output lines D1–D7 are not connected to RAM array 148 in the ×1 mode.

If it is desired to operate memory circuit 146 in the ×2 mode, the user of memory circuit 146 provides a four bit address to the first four input terminals of address control logic 166. An appropriate depth and width mode selection signal is applied to multiplexer decoder 158, which results in control signals at output 160 that direct address control logic 166 to pass a four bit column address to column decoder 170.

If the four bits of the column address signal in the ×2 mode are high, low, low, and low, column decoder 170 will generate a logical high signal on the 0th (top) output line 174. Because the 0th output line 174 is connected to the ×2 input of multiplexers 162 in both column 0 and column 1, the column select lines 180 in column 0 and column 1 both go high, turning on pass transistors 182 in column 0 and column 1. Because pass transistors 182 in column 0 and column 1 are on, data bits from memory cells in column 0 and column 1 are provided in parallel to the demultiplexers 164 in column 0 and column 1. Output routing lines 184 connect the outputs of the demultiplexers 164 in column 0 and column 1 to output data lines D0 and D1. Data output lines D2–D7 are not connected to RAM array 148 in the ×2 mode.

At the same time that the column address is used to address data in one or more columns of RAM array 148, row decoder 190 accepts a six bit row address signal at input 192 that is used to address a selected one of the 64 rows of memory cells 150 in array 148. Output lines 194 of row decoder 190 drive 32 1:2 read/write demultiplexers 196, which receive a read/write select signal via line 198. If data is to be read from RAM array 148, demultiplexers 196 direct the signal from lines 194 to read word lines 200. If data is to be written to RAM array 148, demultiplexers 196 direct the signal from lines 194 to write word lines 202. A variety of different designs may be used for memory cell 150. If desired, a memory cell 150 that is addressed by a single word line and a single bit line may be used.

Figure 4:
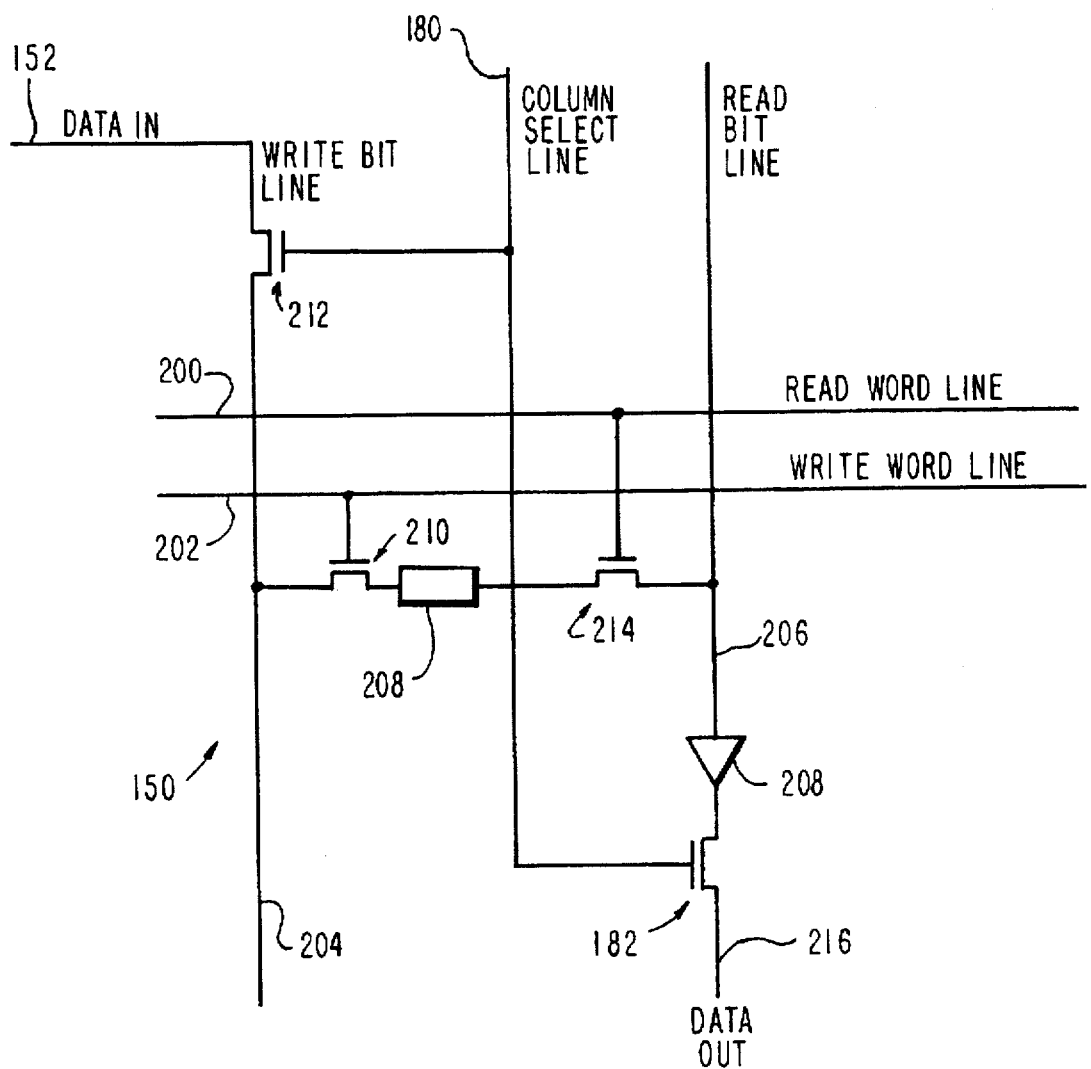
FIG. 4 is a circuit diagram of a memory cell of the memory device of FIG. 3.

As shown in FIG. 4, each memory cell 150 preferably has an associated vertical write bit line 204, which provides data to be written into memory cell 150 from data input line 152 (FIG. 3). Data is read out of memory cell 150 using read bit line 206. Write bit line 204 and read bit line 206 are data lines. Read word line 200, write word line 202, and column select line 180 are address lines.

Data is stored in storage element 208, which may be based on, e.g., dynamic RAM (DRAM), static RAM (SRAM), erasable programmable read-only memory (EPROM), electrically-erasable programmable read-only memory ($E^2$PROM), flash memory, or any other suitable addressable memory technology. Preferably, storage element 208 is a four transistor SRAM cell that stores a single data bit.

In order to write a data bit into storage element 208, write word line 202 and column select line 180 are placed in a high logical state. Each memory cell 150 contains a transistor 210, which is turned on when write word line 202 is high. Each column of memory cells 150 contains a transistor 212, which is turned on when column select line 180 is high. Because transistors 210 and 212 are on when write word line 202 and column select line 180 are high, the data bit passes from data input line 152 to storage element 208 via write bit line 204. Read word line 200 is low, so transistor 214 is off.

To read a data bit from storage element 208, read word line 200 and column select line 180 are placed in a logical high state, which turns on transistor 214 and pass transistor 182. Because transistor 214 and pass transistor 182 are on, the data bit passes from storage element 208 to data out terminal 216. Buffer 218 is used to increase the signal strength of the data bit on line 206. Write word line 202 is low, so transistor 210 is off.

The foregoing is merely illustrative of the principles of this invention and various modifications can be made by those skilled in the art without departing from the scope and spirit of the invention. For example, the memory circuit can have different numbers of rows and columns of memory cells and the circuitry used to address the memory cells can be any suitable size.

What is claimed is:

1. A programmable variable depth and width random-access memory circuit, comprising:

a random-access memory array having a plurality of rows and columns of memory cells for storing data;

a plurality of data output lines;

a row decoder connected to said random-access memory array for addressing said rows of memory cells;

column address circuitry having a column decoder connected to said random-access memory array for addressing said columns of memory cells, said column address circuitry receiving a mode selection signal indicative of a desired depth and width for said memory circuit, said column address circuitry simultaneously addressing a predetermined number of said columns based on said mode selection signal, said predetermined number being equal to said desired width; and output circuitry connected to said random-access memory array for providing said data from said random-access memory array to said predetermined number of said data output lines.

2. The memory circuit of claim 1 wherein said column address circuitry further comprises:
a plurality of column decoder output lines connected to said column decoder for receiving column decoder output signals;
a plurality of groups of input routing lines;
a plurality of fixed connections between said column decoder output lines and said input routing lines for routing said column decoder output signals from said column decoder output lines to said input routing lines;
a plurality of multiplexers each having a plurality of multiplexer inputs connected to one of said groups of input routing lines and a multiplexer output; and
a plurality of column selection lines each connected to one of said multiplexer outputs and being associated with a respective one of said columns of said memory cells.

3. The memory circuit of claim 2 further comprising a plurality of pass transistors each having a gate terminal connected to one of said column selection lines, a pass transistor input terminal connected to one of said columns of memory cells, and a pass transistor output terminal.

4. The memory circuit of claim 3 wherein said output circuitry further comprises:
a plurality of groups of output routing lines;
a plurality of demultiplexers each having a demultiplexer input connected to a respective one of said pass transistor output terminals and each having a plurality of demultiplexer outputs connected to one of said groups of output routing lines; and
a plurality of fixed connections between said output routing lines and said data output lines.

5. The memory circuit of claim 4 wherein said demultiplexers receive said mode selection signal and selectively pass said data from said demultiplexer inputs to said demultiplexer outputs based on said mode selection signal.

6. The memory circuit of claim 2 wherein said multiplexers receive said mode selection signal and selectively pass said column decoder output signals from said multiplexer inputs to said multiplexer outputs based on said mode selection signal.

7. The memory circuit of claim 1 wherein said column address circuitry further comprises control logic for receiving a column address signal and said mode selection signal, said control logic providing said column address signal to said column decoder and providing at least one logical signal of a predetermined fixed value to said column decoder when said mode selection signal indicates that said width is at least two.

8. A method of programmably varying the depth and width of a random-access memory circuit having a random-access memory array with a plurality of rows and columns of memory cells, a plurality of data output lines, a row decoder, and column address circuitry containing a column decoder, the method comprising the steps of:
storing data in said memory cells;
addressing said rows of memory cells with said row decoder;
receiving a mode selection signal with said column address circuitry that is indicative of a desired depth and width for said memory circuit;
simultaneously addressing a predetermined number of said columns with said column address circuitry based on said mode selection signal, said predetermined number being equal to said desired width; and
providing said data from said random-access memory array to said predetermined number of said data output lines.

9. The method of claim 8 wherein said memory circuit further comprises a plurality of column decoder output lines connected to said column decoder, a plurality of groups of input routing lines, a plurality of fixed connections between said column decoder output lines and said input routing lines, and a plurality of multiplexers each having a multiplexer output and each having a plurality of inputs connected to one of said groups of input routing lines, the method further comprising the steps of:
receiving column decoder output signals from said column decoder with said column decoder output lines;
routing said column decoder output signals from said column decoder output lines to said multiplexer inputs with said fixed connections and said input routing lines; and
passing said column decoder output signals from said multiplexer inputs to said multiplexer outputs.

10. The method of claim 9 wherein said memory circuit further comprises a plurality of column selection lines each connected to one of said multiplexer outputs, the method further comprising the steps of:
receiving said column decoder output signals from said multiplexer outputs with said column selection lines; and
simultaneously addressing said predetermined number of columns with said column selection lines.

11. The method of claim 10 wherein said memory circuit further comprises a plurality of pass transistors, the method further comprising the step turning on said predetermined number of said pass transistors to provide said data from said predetermined number of columns.

12. The method of claim 11 wherein said memory circuit further comprises a plurality of groups of output routing lines, a plurality of demultiplexers each having a demultiplexer input and each having a plurality of demultiplexer outputs connected to one of said groups of output routing lines, and a plurality of fixed connections, the method further comprising the steps of:
receiving said data from said pass transistor output terminals with said demultiplexer inputs;
passing said data from said demultiplexer inputs to said demultiplexer outputs; and
routing said data from said demultiplexer outputs to said data output lines via said fixed connections and said output routing lines.

13. The method of claim 12 further comprising the steps of:
receiving said mode selection signal with said demultiplexers; and
selectively passing said data from said demultiplexer inputs to said demultiplexer outputs based on said mode selection signal.

14. The method of claim 9 further comprising the steps of:
receiving said mode selection signal with said multiplexers; and
selectively passing said column decoder output signals from said multiplexer inputs to said multiplexer outputs based on said mode selection signal.

15. The method of claim 8 wherein said column address circuitry comprises control logic, the method further comprising the steps of:

receiving a column address signal and said mode selection signal with said control logic; and providing said column address signal and at least one logical signal of a predetermined fixed value to said column decoder with said control logic when said mode selection signal indicates that said width is at least two.

* * * * *